United States Patent

Brosio et al.

[11] 4,319,203
[45] Mar. 9, 1982

[54] PERFORMANCE-STABILIZATION SYSTEM FOR AN ELECTRICAL COMPONENT EMITTING PULSED ENERGY

[75] Inventors: Alberto Brosio, Borgaro Torinese; Vittorio Seano, Turin, both of Italy

[73] Assignee: CSELT Centro Studi e Laboratori Telecomunicazioni S.p.A, Turin, Italy

[21] Appl. No.: 66,534

[22] Filed: Aug. 15, 1979

[30] Foreign Application Priority Data

Aug. 16, 1978 [IT] Italy ........................ 68910 A/78

[51] Int. Cl.³ ............................................. H01S 3/13
[52] U.S. Cl. ....................................................... 372/30
[58] Field of Search .................. 331/94.5 S, 94.5 M, 331/94.5 H

[56] References Cited

U.S. PATENT DOCUMENTS

| | | | |
|---|---|---|---|
| 3,869,680 | 3/1975 | Fletcher et al. | 331/94.5 M |
| 4,019,048 | 4/1977 | Maione et al. | 331/94.5 M |
| 4,025,875 | 5/1977 | Fletcher et al. | 331/94.5 S |
| 4,181,901 | 1/1980 | Heyke | 331/94.5 S |
| 4,237,427 | 12/1980 | Holland | 331/94.5 S |

Primary Examiner—William L. Sikes
Assistant Examiner—Leon Scott, Jr.
Attorney, Agent, or Firm—Karl F. Ross

[57] ABSTRACT

An emitter of unbalanced pulse-modulated energy, specifically a laser, has a feedback circuit including a first branch detecting the mean amplitude of the emitted energy and a second branch detecting the peak amplitude of its pulses. The second branch includes a bandpass filter, centered on the pulse cadence, followed by a peak detector which may comprise a coherent demodulator driven by a square wave whose frequency corresponds to that cadence. The peak detector generates a control signal for a pulse former whose output signals are superimposed upon a biasing signal from the first branch before being fed to the modulating input of the energy emitter.

5 Claims, 1 Drawing Figure

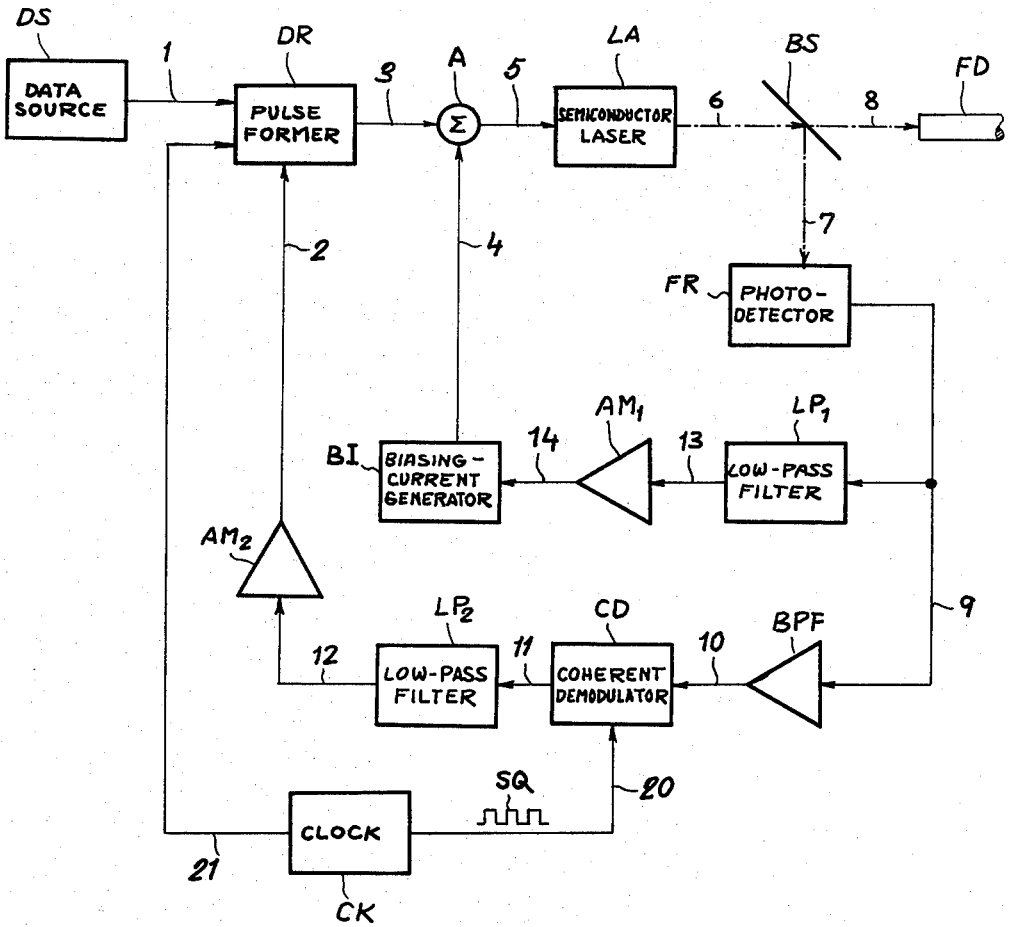

ID=4,319,203

PERFORMANCE-STABILIZATION SYSTEM FOR AN ELECTRICAL COMPONENT EMITTING PULSED ENERGY

FIELD OF THE INVENTION

Our present invention relates to a system for stabilizing the performance of an electrical component emitting pulsed energy in radiant form or as signals transmitted over a line.

BACKGROUND OF THE INVENTION

Communication systems utilizing binary pulses for high-speed message transmission generally require stabilization of the performance of their pulse-emitting components, whether they be primary sources such as traveling-wave tubes, lasers and the like or secondary treatment stages such as power amplifiers, in a condition of maximum efficiency as concerns both the shape and the amplitude of the emitted pulses. Such stabilization, designed to counteract the effects of temperature changes and aging, may be obtained by negative feedback with the aid of control signals derived from both the mean and the peak-to-peak power of the pulse sequence.

A signal proportional to the mean power of a series of unbalanced pulses can readily be produced by integration, pursuant to conventional techniques. To measure the peak-to-peak power—i.e. the RMS amplitude difference between the randomly alternating high-level and low-level pulses—it has heretofore been necessary, however, to use a detector of small time constant and an amplifier whose performance characteristics must be similar to those of the equipment designed to receive and demodulate the transmitted message pulses. These requirements can be satisfied only with rather complex and expensive circuitry.

OBJECTS OF THE INVENTION

The general object of our present invention, therefore, is to provide simplified circuitry for stabilizing the performance of an electrical emitter of energy modulated by unbalanced binary pulses occurring with equal probability at either level.

A more particular object is to provide such circuitry for a pulsed laser.

SUMMARY OF THE INVENTION

A system embodying our invention comprises extraction means connected to an output of the energy-emitting electrical component for recovering a fraction of the energy of each emitted message pulse and delivering same to a band-pass filter, which could be a frequency-selective amplifier, having a pass band centered on the recurrence frequency of the message pulses. The filter works into a peak detector which generates a feedback signal proportional to the amplitude of the recovered energy fraction of at least some of the high-level message signals. This feedback signal is transmitted by a control circuit to the pulse-emitting component for stabilizing the amplitude of its outgoing high-level pulses in response thereto.

Pursuant to a more particular feature of our invention, the peak detector comprises a coherent demodulator which is driven by a train of clock pulses in step with the message pulses, i.e. with a cadence corresponding to the aforementioned recurrence frequency. Such a coherent demodulator is especially advantageous where high and low message pulses are invariably paired in each clock cycle, as with the so-called Manchester code, in a sequence depending on the logical value ("0" or "1") to be transmitted; when the clock pulses are a square wave in quadrature with the message pulses, a positive (or negative) pulse present in one or the other half of each cycle of that square wave—depending on the logical value (0 or 1) to be conveyed—will invariably coincide with half a high-level message pulse so that the output signal of this demodulator, upon integration, will be a direct current proportional to the pulse amplitude.

When this output signal is used in a negative-feedback loop to control the amplitude of modulating pulses designed to drive a laser, these latter pulses are advantageously superimposed upon a biasing current conventionally derived from the mean amplitude of the outgoing message signal to establish a predetermined operating point for the laser. Particularly with a laser of the semiconductor type, that operating point advantageously lies slightly above the threshold at which the laser characteristic, representing radiation intensity plotted against excitation current, changes sharply from a near-zero slope (when the laser behaves merely as a light-emitting diode) to a steep rise. When the operating point is chosen at or below the threshold, the outgoing message signal tends to be distorted; on the other hand, the choice of a significantly higher operating point reduces the so-called extinction ratio, defined as the power ratio of the high-level and low-level signal constituents.

With the aforementioned Manchester code or any equivalent thereof, the message signal has a well-defined spectral line corresponding to the recurrence frequency of the pulses. Thus, the band-pass filter preceding the peak detector of our present system need not be highly frequency-selective.

BRIEF DESCRIPTION OF THE DRAWING

The above and other features of our invention will now be described in detail with reference to the accompanying drawing, the sole FIGURE of which is a block diagram of an embodiment for stabilizing the performance of a pulsed laser.

SPECIFIC DESCRIPTION

As shown in the drawing, a data source DS has an output 1 extending to a pulse former DR which translates the oncoming message symbols into unbalanced binary pulses, preferably with pairing of high-level and low-level current pulses in accordance with the codes referred to above. These pulses are fed to an input 3 of an adder A connected to a driving input 5 of a semiconductor-type laser LA. The pulse-modulated beam emitted by that laser, symbolized by a phantom line 6, is intercepted by a beam splitter BS in the form of a semi-transparent mirror which passes the major part of the incident radiation, as indicated at 8, to the receiving end of an optical fiber FD serving as a message transmitter. A minor proportion 7 of that radiation is reflected onto a photodetector FR whose output 9 is connected in parallel to a low-pass filter $LP_1$ and a band-pass filter BPF; the latter is designed as a frequency-selective amplifier and has a band pass centered on the recurrence frequency of the modulating pulses as determined by a clock circuit CK which has an output 20, terminating at a coherent demodulator CD which acts as the aforementioned peak detector, and another output 21 leading to a synchronizing input of pulse former DR.

Filter $LP_1$ integrates the output signal of photodetector FR and works into an input 13 of a conventional amplifier $AM_1$ of high sensitivity and low drift, e.g. one of the sample-and-hold type, whose output 14 feeds a biasing-current generator BI connected to another input 4 of adder A in order to compensate for drifts of the current threshold of laser LA due to temperature changes or aging of the semiconductor, for example.

Band-pass filter BPF, which is of moderate selectivity, passes the recurrence frequency or pulse cadence corresponding to the aforementioned spectral line to an input 10 of demodulator CD receiving from clock circuit CK a square wave SQ whose frequency equals that pulse cadence. If wave SQ is in quadrature with the message pulses, every other half-cycle of that wave will open a gate inside the demodulator for a period long enough to pass about half of a high-level pulse from the output 9 of photodetector FR. These pulses are integrated in a low-pass filter $LP_2$ which has an input 11 connected to demodulator CD and an output 12 extending to an amplifier $AM_2$, also of good sensitivity and low drift. Amplifier $AM_2$ has an output 2 extending to an amplitude-controlling input of pulse former DR. The amplitude-controlled current pulses issuing from circuit DR, superimposed in adder A upon the reference current from generator BI, determine the amplitude difference between the high-level and low-level message pulses emitted by laser LA, with due consideration to its operating characteristic.

Thus, our disclosed system comprises two distinct feedback loops $LP_1$, $AM_1$, BI and BPF, CD, $LP_2$, $AM_2$, the second loop encompassing the pulse former or driver DR.

If the laser is replaced by an emitter of pulse-modulated radio-frequency signals, a minor fraction of the outgoing message energy may be extracted by a resistive, inductive or capacitive coupler (e.g. a voltage divider), feeding an r-f detector, in lieu of the beam splitter BS coacting with photodetector FR. The remainder of the system could be substantially identical with that shown in the drawing.

We claim:

1. A system for sending out stabilized binary message signals, comprising:

a semiconductor laser emitting a beam of radiant energy to an optical fiber upon being excited by a current exceeding a predetermined threshold;

pulse-forming means connected to said laser for modulating the emitted energy by a series of randomly alternating low-level and high-level message pulses of predetermined recurrence frequency representing data to be transmitted;

extraction means connected to an output of said laser for recovering a fraction of the energy of each emitted message pulse;

a band-pass filter connected to said extraction means and provided with a pass band centered on said recurrence frequency;

peak-detection means connected to said band-pass filter for generating a feedback signal proportional to the magnitude of the recovered energy fraction of at least some of said high-level message pulses, said peak-detection means comprising a coherent demodulator driven by a train of clock pulses of a cadence equal to said recurrent frequency;

a connection extending from said peak-detection means to a control input of said pulse-forming means for stabilizing the amplitude of said high-level message pulses in response to said feedback signal;

integrating circuitry connected to said extraction means in parallel with said band-pass filter for averaging the recovered energy fraction;

a current generator in cascade with said integrating circuitry deriving from the averaged energy fraction a biasing signal in the form of a reference current slightly exceeding said threshold, said reference current being fed to said laser for establishing a predetermined operating point therefor; and an adder inserted between said pulse-forming means and a driving input of said laser, said adder having an input connected to said current generator for delivering a combination of said biasing signal and said message pulses to said driving input.

2. A system as defined in claim 1 wherein said band-pass filter comprises a frequency-selective amplifier.

3. A system as defined in claim 1 wherein said pulse-forming means comprises a coder controlled by said clock pulses for generating a sequence of pulse pairs each consisting of a low-level message pulse and a high-level message pulse, said clock pulses being a square wave having cycles in quadrature with said pulse pairs whereby alternate half-cycles of said square wave each coincide with half a high-level message pulse.

4. A system as defined in claim 1 or 3 wherein said extraction means comprises a photodetector and a beam splitter positioned to illuminate said photodetector with radiation emitted by said laser.

5. A system as defined in claim 4 wherein said beam splitter is a partly reflecting semitransparent mirror transmitting a major part of the emitted radiation to an optical fiber aligned with said laser.

* * * * *